(12) United States Patent
Alfke

(10) Patent No.: US 6,407,612 B1
(45) Date of Patent: Jun. 18, 2002

(54) METHOD AND SYSTEM FOR SUPPRESSING INPUT SIGNAL IRREGULARITIES

(75) Inventor: Peter H. Alfke, Los Altos Hills, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/703,127

(22) Filed: Oct. 30, 2000

(51) Int. Cl.⁷ ................................................ H03K 17/16
(52) U.S. Cl. ........................ 327/379; 327/166; 327/225; 327/299
(58) Field of Search ................... 327/379, 100, 327/107, 165, 166, 225, 276, 277, 284, 291, 293, 294, 299, 384, 389, 391; 326/23, 24, 26, 27

(56) References Cited

U.S. PATENT DOCUMENTS

| | | | | |
|---|---|---|---|---|
| 4,560,889 A | * | 12/1985 | Hayashi ..................... 327/143 |
| 4,731,553 A | * | 3/1988 | Van Lehn et al. ............. 326/27 |
| 5,369,315 A | * | 11/1994 | Tran ............................. 326/82 |
| 5,708,386 A | * | 1/1998 | Chow ......................... 327/380 |
| 5,786,719 A | * | 7/1998 | Furutani ..................... 327/202 |
| 5,831,447 A | * | 11/1998 | Chaw .......................... 326/27 |
| 5,883,538 A | * | 3/1999 | Keeth et al. ................. 327/333 |
| 5,933,048 A | * | 8/1999 | Hidaka et al. ............... 327/534 |
| 5,963,047 A | * | 10/1999 | Kwong et al. ................ 326/27 |
| 6,249,141 B1 | * | 6/2001 | Aspacio et al. ............... 326/29 |

* cited by examiner

*Primary Examiner*—Toan Tran
*Assistant Examiner*—Hai L. Nguyen
(74) *Attorney, Agent, or Firm*—Adam H. Tachner; Lois D. Cartier

(57) ABSTRACT

An input signal latching circuit for suppressing the effect of any ringing or other irregularities that occur within a specified time period after a transitional voltage level is reached, without significantly delaying the propagation of the input signal.

3 Claims, 2 Drawing Sheets

METHOD AND SYSTEM FOR SUPPRESSING INPUT SIGNAL IRREGULARITIES

FIELD OF THE INVENTION

The invention relates generally to the field of integrated circuit devices, and more particularly to reducing the effect of ringing and other undesirable characteristics in an input clock signal.

BACKGROUND OF THE INVENTION

Many complex integrated circuit devices depend upon clear input signals (particularly unambiguous clock signals) in order to synchronize complex combinatorial logic functions and thereby generate accurate, predictable results. One common signal problem is ringing—voltage oscillations above and below the eventual steady-state level. Ringing is often caused by reflections on improperly terminated transmission lines on printed circuit boards. A signal that exhibits ringing retreats (undershoots or rings back) from its initial maximum-high or minimum-low level. If the signal retreats too far, the receiving circuit can read it as the wrong value. If the signal is a clock, false triggering can result. The clock signal illustrated in FIG. 1 illustrates common ringing characteristics.

One available method of avoiding the consequences of ringing on data lines is to wait for the reflections to subside before allowing the system to process new data. However, to achieve the extra delay in existing systems one must either add one or more clock cycles to each operation, or reduce the system's clock frequency. Neither of these options is particularly desirable. Further, these methods are not applicable to ringing on clock lines.

While there are numerous schemes available to ensure that clocking signals are relatively free of irregularities, there remains a need in the art for a system and method of suppressing signal irregularities and their effects without otherwise slowing system performance.

SUMMARY OF THE INVENTION

To address the shortcomings of the available art, the present invention provides an input signal latching circuit for suppressing the effect of any ringing or other irregularity that occurs within a specified time period after an incoming voltage transition, and doing so without significantly delaying the propagation of the input transition to the intended recipient device.

The invention provides, in an integrated circuit device receiving an input signal, the input signal including sporadic irregularities during transitions between high and low signal levels, a circuit for suppressing the irregularities and forwarding an improved input signal without substantially delaying propagation of the input signal to the device. In one embodiment of the invention, the circuit comprises a delay element in electrical communication with the input signal. The delay element forwards to an output node a version of the input signal delayed by a time duration X. The circuit also includes logic means, positioned between the delay element output node and a latch, that selectively forwards either the input signal or the delayed version of the input signal to the latching element. Therefore, the latch latches the first transition of the input signal, thereby suppressing irregularities in the input signal during the time duration X after the input signal crosses a transition between a high and low signal level.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings.

Figure 1:
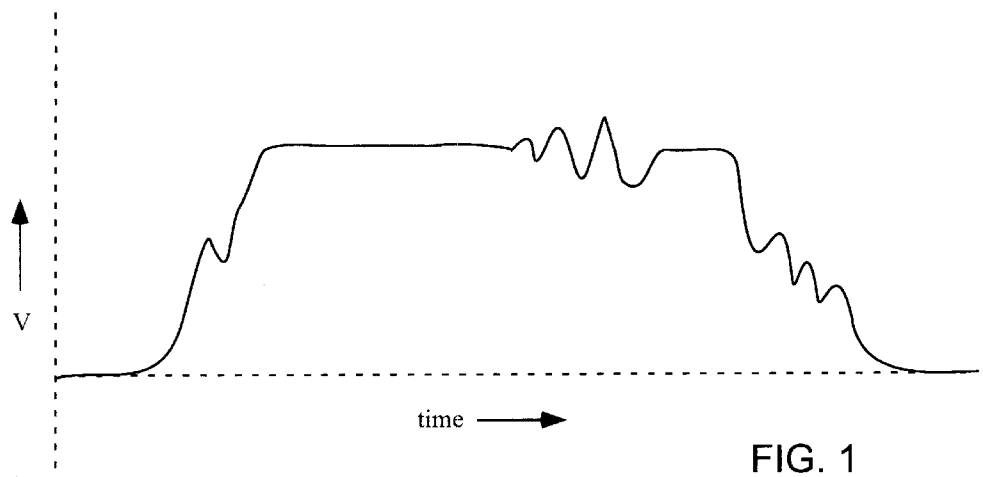
FIG. 1 illustrates ringing in a clock signal.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE DRAWINGS

Figure 2:
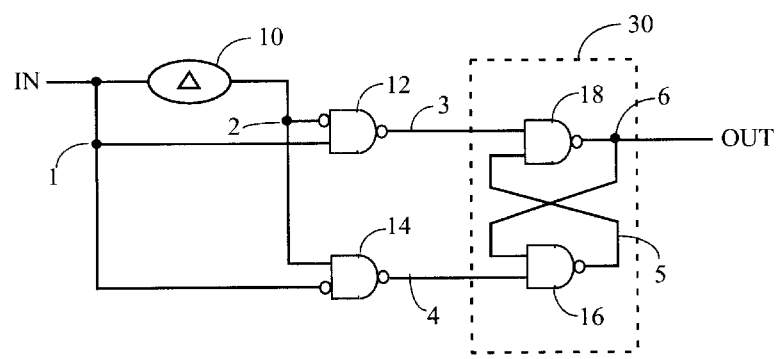
FIG. 2 is a diagram illustrating a preferred implementation of the inventive latching mechanism.

FIG. 2 illustrates the preferred signal irregularity suppression circuit of the present invention. The incoming clock signal (node 1), is forwarded to a delay circuit 10 (preferably a plurality of inverters connected in series). Delay circuit 10 imposes a delay that is preferably longer than the clock transition time (including reflection, ringing, noise, etc.) and shorter than the high or low level on the clock signal. The delayed clock signal is forwarded through node 2, inverted, and logically NANDed at gate 12 with the undelayed clock signal forwarded through node 1. The input clock signal forwarded through node 1 is also inverted and logically NANDed at gate 14 with the delayed clock signal forwarded through node 2. The NAND gate output signals provide the set and reset inputs for latching element 30.

A brief description of the circuit behavior is now provided. Assume that the input node 1 has been low for a sufficient time that node 2 is also low. A rising edge on node 1 causes node 3 to go low (because node 2 is still low). The low level on node 3 sets latch 30 (i.e., node 6 goes high and node 5 goes low). Further activity on nodes 1 and 2 has no effect on node 6, until node 1 has been high for some time, followed by a falling edge on node 1. In other words, while node 2 remains low, the circuit protects latch 30 against the detection of noise and ringing on node 1.

Similarly, when a falling edge occurs on node 1 after a prolonged high level, node 4 goes low, resetting latch 30 (i.e., node 6 goes low and node 5 goes high).

Note that, as is typical of Set-Reset latches, nodes 3 and 4 should not both be active (low) at the same time. NAND-gates 12 and 14 and delay element 10 guarantee that this situation cannot occur in the circuit of FIG. 2.

Figure 3:
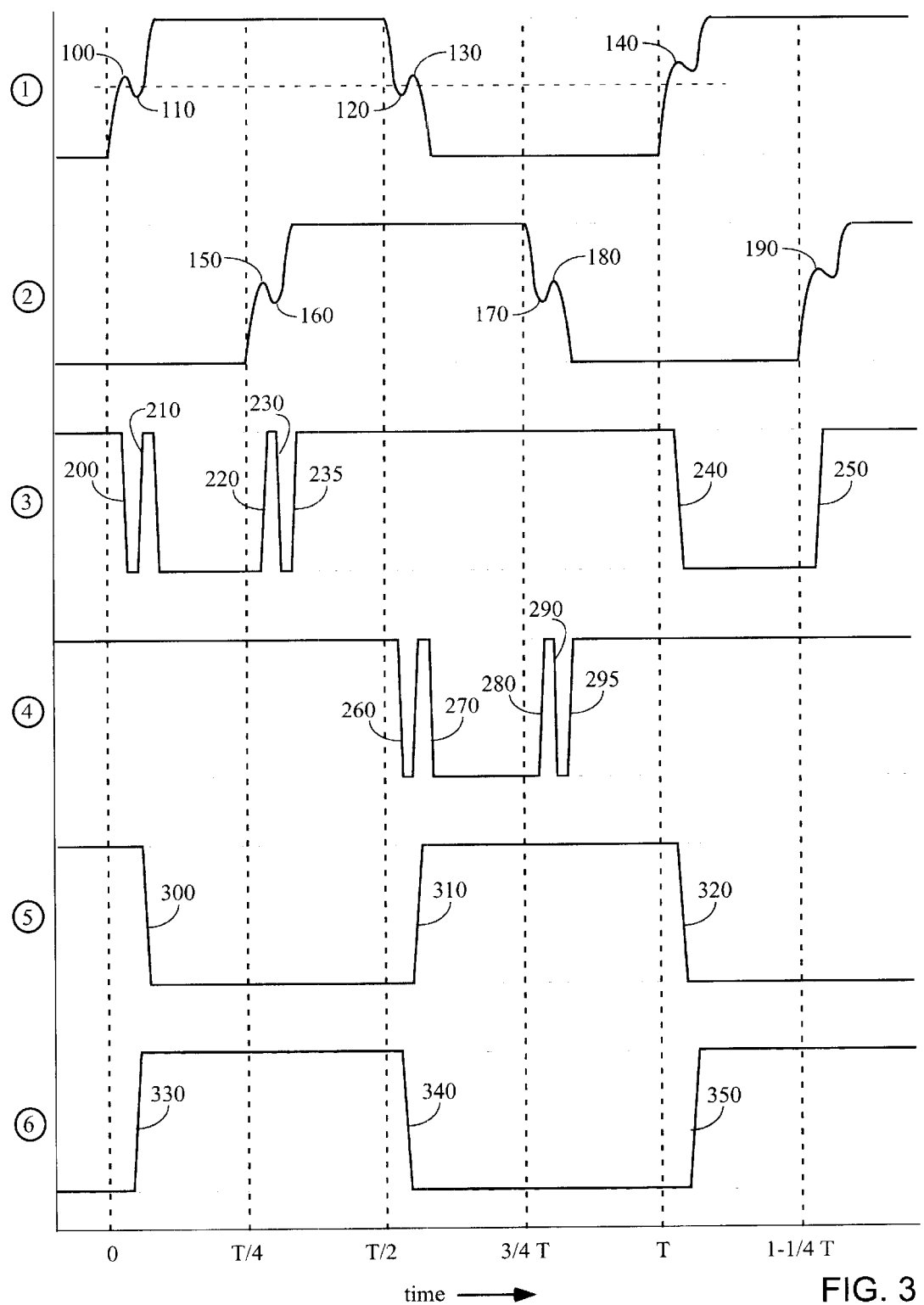
FIG. 3 illustrates over time the state of various nodes within the circuit of FIG. 2.

FIG. 3 provides an example of operation in which ringing in a clock signal is suppressed using the circuit of FIG. 2. Timing diagrams 1–6 of FIG. 3 correspond to the signals at nodes 1–6, respectively, of FIG. 2. These timing diagrams illustrate how the inventive circuit of FIG. 2 removes ringing and other high frequency "hiccups" from a signal without significantly delaying propagation of the signal. As illustrated, the input clock signal forwarded through node 1 includes a "hiccup" component 100 on the rising edge that exceeds the threshold voltage (indicated by a horizontal dashed line), triggering a logic high signal. This change causes the signal at node 3 to go low, as illustrated at 200. The output signal at node 6 then goes high (330) because of the high output signal at NAND gate 18, in turn causing the signal at node 5 to drop to logic low (300).

When the input signal irregularity then drops below the minimum voltage (110), a logic low input signal is forwarded to NAND gate 12 and the output signal at node 3 returns to high (210). However, this change does not affect the output signal of NAND gate 18 at node 6, because the signal at node 5 remains low, forcing NAND gate 18 to continue to provide a logic high value.

Similar results occur when the delayed input signal at node 2 reaches the first input signal irregularity (150). The rising edge (150) causes the signal at node 3 to go high (220), but the signal at node 5 remains low, thereby maintaining the output signal at node 6 at logic high. When the irregularity drops below the threshold voltage (160), the signal at node 3 goes low again (230). However, the signal at node 3 returns to high (235) after the delayed signal at node 2 returns to a high level.

Returning to node 1, on the falling edge at 120 the signal at node 4 goes low (260), driving the signal at node 5 high (310). With two logical high values at its input terminals, the output of NAND gate 18 at node 6 goes low (340). Note that the first part of the input signal has been captured without carrying through any of the irregularities to the output clock signal, and without introducing any significant delay (other than the fractions of a nanosecond introduced by propagation through several logic gates). Further irregularities 130, 170, and 180 cause fluctuations 270, 280, 290, and 295 in the signal at node 4. However, because the signal at node 6 is still low, the output 5 of NAND gate 16 remains at a logic high level.

On the next low-to-high transition of the input clock signal, irregularity 140 occurs but does not return the input clock signal below the threshold voltage. The signal at node 3 goes to logic low 240, which, in turn, causes the signal at node 6 to go high. In turn, the signal at node 5 goes to logic low and the whole process is repeated. As can be seen at node 6 in FIG. 3, the resulting output clock signal has the same period as input clock signal 1 without any high frequency "hiccups" or other irregularities.

The present invention therefore provides a novel method and apparatus for insulating a circuit or integrated circuit device from input signal irregularities without substantially delaying the input signal. Although the present invention has been shown and described with respect to a preferred embodiment, various changes and modifications lie within the spirit and scope of the claimed invention. For example, any or all of NAND-gates 12, 14, 16, 18 could be substituted by OR-gates using the de Morgan equivalent circuits, as is well known in the art. Further, the present invention is not limited to reducing ringing in clock signals, but can also be used for suppressing full-amplitude transitions or for other purposes. Thus, the corresponding structures, materials, acts, and equivalents of all means or step plus function elements in the claims are intended to include any structure, material, or acts for performing the functions in combination with other elements as specifically claimed.

What is claimed is:

1. In an integrated circuit device receiving an input signal, the input signal including sporadic irregularities during transitions between high and low signal levels, a circuit for suppressing the irregularities and forwarding an improved input signal without substantially delaying propagation of the input signal to the device, the circuit comprising:

a delay element in electrical communication with the input signal, the delay element forwarding to an output node a version of the input signal delayed by a time duration X; and logic means, positioned between the delay element output node and a latch, for selectively forwarding the logical signal level of either of the input signal or the delayed version of the input signal to the latching element, the latch latching a first transition of the input signal, thereby suppressing irregularities in the input signal during the time duration X after the first transition of the input signal.

2. In an integrated circuit device receiving an input signal, the input signal including sporadic irregularities when transitioning between high and low signal levels, a circuit for suppressing the irregularities and forwarding an improved input signal without substantially delaying propagation of the input signal to the integrated circuit device, the circuit comprising:

a delay element in electrical communication with the input signal, the delay element forwarding to an output node a version of the input signal delayed by a time duration X;

a first logic gate receiving at a first input node the delayed version of the input signal from the delay element output node and at a second input node the input signal inverted and providing an output signal at an output rode;

a second logic gate receiving at a first input node the delayed version of the input signal from the delay element output node inverted and at a second input node the input signal and providing an output signal at an output node; and a latch, connected to sequentially receive and forward the output signals of either of the first and second logic gates, thereby suppressing irregularities in the input signal during the time duration X after the input signal crosses a transition between a high did low signal level.

3. In an integrated circuit device receiving an input signal, the input signal including sporadic irregularities when transitioning between high and low signal levels, a method of suppressing the irregularities and forwarding an improved input signal without substantially delaying propagation of the input signal to the device, the method comprising:

receiving the input signal and generating a version of the input signal delayed by a time duration X;

latching a first transition of the input signal and ignoring subsequent transitions on the Input signal during time duration X; and forwarding the latched signal to the device.

* * * * *